US006493268B1

United States Patent
Khouri et al.

(10) Patent No.: US 6,493,268 B1
(45) Date of Patent: Dec. 10, 2002

(54) CIRCUIT DEVICE FOR PERFORMING HIERARCHIC ROW DECODING IN NON-VOLATILE MEMORY DEVICES

(75) Inventors: Osama Khouri, Milan (IT); Andrea Pierin, Graffignana (IT); Rino Micheloni, Turate (IT); Stefano Gregori, Torre d'Isola (IT); Guido Torelli, Sant'Alessio con Vialone (IT); Miriam Sangalli, Carugate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/905,163

(22) Filed: Jul. 12, 2001

(30) Foreign Application Priority Data

Jul. 13, 2000 (IT) .......................................... MI20A1585

(51) Int. Cl.[7] .............................................. G11C 16/00
(52) U.S. Cl. .............................. 365/185.23; 365/230.06
(58) Field of Search ....................... 365/185.23, 230.06, 365/230.03

(56) References Cited

U.S. PATENT DOCUMENTS

| 5,282,175 | A | | 1/1994 | Fujita et al. | ............ | 365/230.06 |
| 5,506,816 | A | | 4/1996 | Hirose et al. | .......... | 365/230.06 |
| 5,513,146 | A | | 4/1996 | Atsumi et al. | ......... | 365/185.35 |
| 5,880,995 | A | | 3/1999 | Kobatake | ................ | 365/185.23 |
| 5,973,963 | A | | 10/1999 | Sugawara | .............. | 365/485.23 |
| 6,026,047 | A | * | 2/2000 | Ryu et al. | ............... | 365/230.06 |
| 6,088,289 | A | * | 7/2000 | Landry et al. | .......... | 365/230.06 |
| 6,118,723 | A | * | 9/2000 | Agata et al. | ............ | 365/230.03 |
| 6,172,934 | B1 | * | 1/2001 | Uchihira | ................ | 365/230.06 |
| 6,320,792 | B1 | * | 11/2001 | Caser et al. | ........... | 365/185.23 |

FOREIGN PATENT DOCUMENTS

EP 0 822 660 A1 2/1998

OTHER PUBLICATIONS

Umezawa, A. et al., "A 5–V–only operation 0.6–mu. M flash EEPROM with row decoder scheme in triple–well structure," IEEE *Journal of Solid–State circuits*, 27(11):1540–1546, Nov. 1992.
Takeshima, T. et al., "A 3.3 V Single–Power–Supply 64Mb Flash Memory with Dynamic Bit–Line Latch(DBL) Programming Scheme," IEEE International Solid State Circuits, vol. 37, pp. 148–149 and 327, Feb. 1994.

* cited by examiner

*Primary Examiner*—Tan T. Nguyen
(74) *Attorney, Agent, or Firm*—Lisa K. Jorgenson; Robert Iannucci; Seed IP Law Group PLLC

(57) ABSTRACT

A circuit device for performing hierarchic row decoding in semiconductor memory devices of the non-volatile type, which memory devices include an array of memory cells with column-ordered sectors, wherein each sector has a respective group of local wordlines linked to a main wordline. The circuit device includes a main wordline driver provided at each main wordline, and a local decoder provided at each local wordline. This circuit device further comprises, for each main wordline, a dedicated path connected between the main wordline and the local decoders of the associated local wordlines and connected to an external terminal arranged to receive a read/program voltage, the dedicated path enabling transfer of the read/program voltage to the local decoders.

20 Claims, 3 Drawing Sheets

CIRCUIT DEVICE FOR PERFORMING HIERARCHIC ROW DECODING IN NON-VOLATILE MEMORY DEVICES

BACKGROUND OF THE INVENTION

1. Field of the Invention

The present invention relates to a circuit device adapted to perform hierarchic row decoding in semiconductor memory devices.

The invention relates, particularly but not exclusively, to a device as above, which is adapted to perform hierarchic row decoding in non-volatile semiconductor memory devices comprising at least one array of memory cells with column-ordered sectors, wherein each sector has a respective local wordline group linked to a main wordline, the circuit device having a main wordline driver provided at each main wordline and a local decoder provided at each local wordline.

One of the most widely used memory array architectures in the manufacture of non-volatile memory devices integrated in a semiconductor, is a NOR type. In such architecture, memory cells that locate in the same row of the array have their gate terminals in common, and memory cells that locate in the same array column have their drain terminals in common. Moreover, all the cells in an array sector have their source terminals in common.

To individuate a particular memory location, it is sufficient that a given row and a given column be selected, for only one memory cell can situate at their intersection. In non-volatile memories, a cell comprises a floating gate transistor having, moreover, drain and source conduction terminals.

The solution proposed has a specific application to decode architectures of the hierarchic type and reference will be made to such architectures for convenience of illustration.

2. Description of the Related Art

A first known type of architecture for non-volatile memory arrays comprises row-ordered sectors and corresponding row decoders associated with each sector.

This architecture uses up much circuit space, since a decoder for each sector must be provided, as well as local column decoders, to avoid the "drain stress" phenomenon.

It is important to further consider that the memory array rows are materialized by polysilicon stripes laid to interconnect all the gate terminals of cells in one row.

From an electrical standpoint, each polysilicon stripe may be regarded as a distributed RC network. For example, the time constant of an array row defined by the RC network is approximately 10 ns, even when the number of cells is relatively small, e.g., 1024.

The above time value represents the time required for an electric signal to propagate through an array row, and directly affects the memory access time, which is required to be the shortest possible, as is well known.

Owing to the high density of cell integration in the integrated memory circuit, the local bitlines and the main bitline are formed by a process that consists of depositing two different layers or metal levels; short-circuiting the polysilicon row and shortening the row charge time become impossible unless a third metal level is provided.

Another known technical solution provides for the non-volatile memory arrays to be column-ordered. In this case, the array rows are shared by all sectors, and the size of a sector is set by the number of columns.

With an architecture of that type, the parasitic capacitance of each bitline is kept quite low, this being of substantial benefit to the circuit portion that is to read the memory contents.

Also, row decoding can be shared by several sectors, with attendant savings of circuit space.

Where an array is fabricated using a technological process that provides for two metal levels, one level is utilized to form the bitlines and the other level utilized to short-circuit the row for lower parasitic resistance during the charging phase.

Although advantageous on many counts, this prior architecture also has a drawback in that, each time that a cell is addressed, all the cells in the same row are biased and subjected to "gate stress".

Furthermore, the information stored in non-volatile memories of the flash EEPROM type must be erased in groups or packets of bits. Erasing is the single operation where the source terminal is biased, and since all the cells have this terminal in common, they must be erased simultaneously, even though they can be written and read independently.

More particularly, flash memories are erased by the sector, meaning that all the cells linked to the same source line are erased simultaneously.

A circuit device adapted to perform erasings by negative voltages in column-ordered memory arrays is disclosed in the Applicant's Published European Patent Application No. 0 991 075. This device is also shown schematically in FIG. 1 in relation to a single array sector, generally designated 1.

It should be noted that the cells contained in the sectors of the non-volatile memory array associated with the device 1 are ordered into plural wordlines or local rows, designated LWL (Local Word Line). In parallel with each array row, a main row- or wordline is provided, which is designated MWL (Main Word Line) and extends through all the sectors that have main rows in common. Within each sector, the circuit device 1 is connected upstream of each local wordline LWL of the memory array.

The memory device is supplied a single supply voltage Vdd, in the range of 2.5 to 3.6 Volts, and is connected to a second reference voltage GND, e.g., a signal ground.

The device 1 comprises a plurality of local decoders 2 connected between each local wordline LWL and the main wordline MWL, to which said local lines are linked.

The device 1 further includes, provided at each main wordline MWL, a main wordline driver 3, which comprises basically a pair of MOS transistors mounted in a pull-up/pull-down configuration and connected between first TVGLOB and second TSRC bias terminals to correspondingly receive first VGLOB and second SRC bias signals.

Each local decoder 2 comprises a first transistor M1 of the PMOS type having one of its conduction terminals connected to the main wordline MWL and the other connected to the local wordline LWL.

The body terminal of transistor M1 receives the first bias signal VGLOB, its gate terminal receiving a first tripping signal PCH.

The gate terminals of all the transistors M1 of the local decoders 2 associated with the array rows in one sector are connected together and receive the same voltage signal.

The local decoder 2 further comprises a second transistor M2 of the NMOS type having one of its conduction terminals connected to the main wordline MWL and the other connected to the local wordline LWL.

The body terminal of transistor M2 receives the second bias signal SRC at a negative voltage (about −8V) during the erase phase, and the transistor gate terminal receives a second tripping signal NCH. The value of the second bias signal SRC is 0V (GND) for the other operations.

The gate terminals of all the transistors M2 of the local decoders 2 associated with the array rows in one sector are connected together and receive the same voltage signal.

Advantageously, an NMOS transistor M3 is connected with its conduction terminals between the local wordline LWL and the second bias terminal TSRC, the latter receiving the second bias voltage SRC as a negative voltage during the erase phase, and the signal ground GND for the other operations.

The body terminal of transistor M3 is connected to the second bias terminal TSRC, its gate terminal receiving a signal DISCH.

The gate terminals of all the transistors M3 of the local decoders 2 associated with the array rows in one sector are connected together and receive the same voltage signal.

In essence, this circuit device performs a row decoding of the hierarchic type by virtue of an additional transistor M3 in the local decoders 2 having one conduction terminal connected to the local wordline and the other connected to a ground voltage reference.

The technological trend toward the use of devices with ever higher cuts and densities in the field of memory devices poses important design problems, which are well recognized and have power consumption in the various modes (read, program, erase, etc.) of the device operation as their major aspect.

It should be noted, however, that most of the above power consumption is attributable to the use of "boosted" voltage generators that comprise charge pump systems integrated to the device. These systems include, for example, the systems employed to generate the read voltage, of about 6V, to the cell gate, and to generate the program voltages, in the 1.5 to 9V range and −4V, to the cell gate and drain, respectively.

Power consumption is in such cases directly proportional to the capacitive loads switched in during the various modes of the device operation.

Furthermore, "boosted" voltage generators have limited efficiency, cannot supply large currents with the output voltage maintained at a desired value, and involve substantial area overhead.

Thus, it can be appreciated that a reduction in power consumption achieved by reducing the driven loads would be a design contribution of great interest on several counts.

In conventional devices, however, the read and program voltages, applied to terminal TVGLOB, will of necessity reach the gate terminal of a selected cell through a driver 3, which is connected to the main wordline MWL, for example as shown in FIG. 1 illustrating the hierarchic decoding circuit device just described.

Note should be taken, moreover, of that the read and program voltage generators are to drive, additionally to the load of the selected main wordline MWL, the capacitive load from the substrates of the pull-up transistors of all the drivers 3, which represents a much heavier contribution because there is just one supply terminal provided for the drivers 3 of the main wordline MWL (in the extreme, it might serve all the main wordline drivers throughout the device).

In addition, the capacitive contributions from the local decodes (specifically, the substrates of the P-channel transistors) should be taken into account.

Thus, the overall switched load at each voltage variation at terminal TVGLOB is a sizable amount. It will be appreciated that this situation results in a high expenditure of power during all the operations involving "fast" switching of terminal TVGLOB (such as the transition from program to verify, and vice versa, during the program phase).

In view of a current-sensing approach method providing for the cell to be suitably biased at its terminals (e.g., $V_{gate}$=6V, $V_{drain}$≈1V, $V_{source}$=0V), and for the sensed electrical quantity—a function of the programmed state of the cell—to be its drain current, whereas the voltage-sensing method provides for the cell to be suitably biased at its drain and source terminals ($V_{drain}$≈1V, $V_{source}$=0V) and for its drain current to be forced to a suitable value, the sensed electrical quantity as a function of the programmed state of the cell being therefore the voltage produced at the cell gate, it is to be emphasized that the aforementioned problems equally affect the current- and voltage-sensing approach methods.

In other words, with conventional hierarchic row decoding, the gate terminal of a selected cell can only be reached electrically by going through a main wordline driver, and this regardless of which sensing method is used.

It should be further noted that, in conventional hierarchic row-decoding devices, the function of selecting the cell gate terminal is not disjoined from the function of transferring read and program voltages. In particular, in such conventional devices, the main wordline is to select an addressed cell by carrying itself the analog read and program voltages to the gate terminal of the cell.

SUMMARY OF THE INVENTION

An embodiment of this invention provides a novel circuit device for hierarchic row decoding, whereby a substantial reduction can be achieved in the capacitive loads that the various circuit systems are to drive during the memory cell programming and reading.

The circuit device for hierarchic row decoding also makes the architecture more flexible, in the sense that appropriate design options (far less critical than those of conventional devices) effectively lessen the capacitive loads driven in the presence of increased device cut.

The circuit device avoids a double function for the main wordline by having it perform the single duty of controlling a suitable switch to enable transfer of the read/program voltage to a local decoder, and through the latter, to the gate terminal of a selected cell.

In other words, the function of transferring the read/program voltage is served by a dedicated path which is distinct from the cell selecting path, and which in no way involves the overall row decode, the main rows and their drivers.

The features and advantages of a device according to the invention will be apparent from the following description of an embodiment thereof, given by way of non-limitative example with reference to the accompanying drawings.

DETAILED DESCRIPTION OF THE INVENTION

Figure 1:
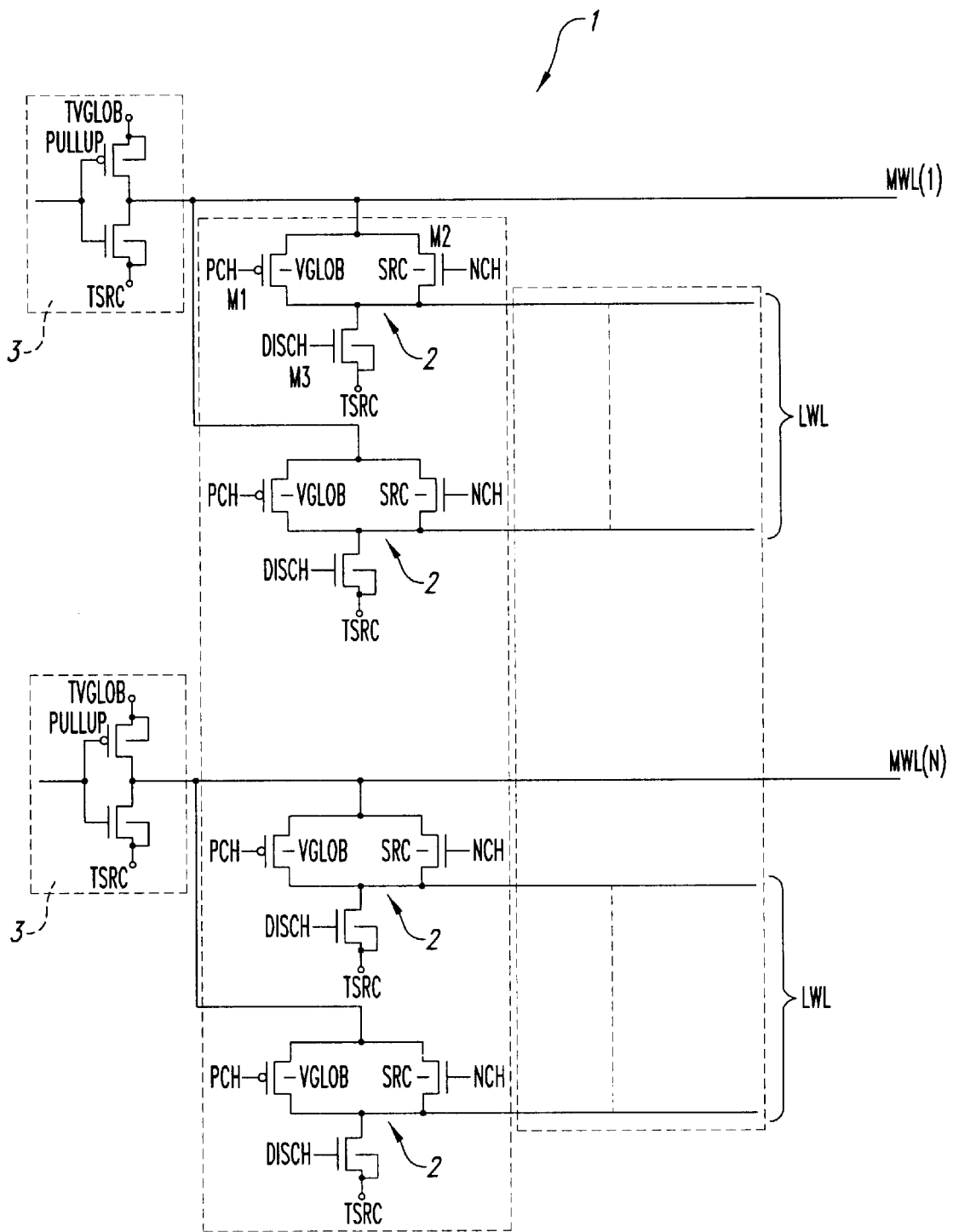
FIG. 1 shows diagramatically a hierarchic row-decoding device according to the prior art.
Figure 2:
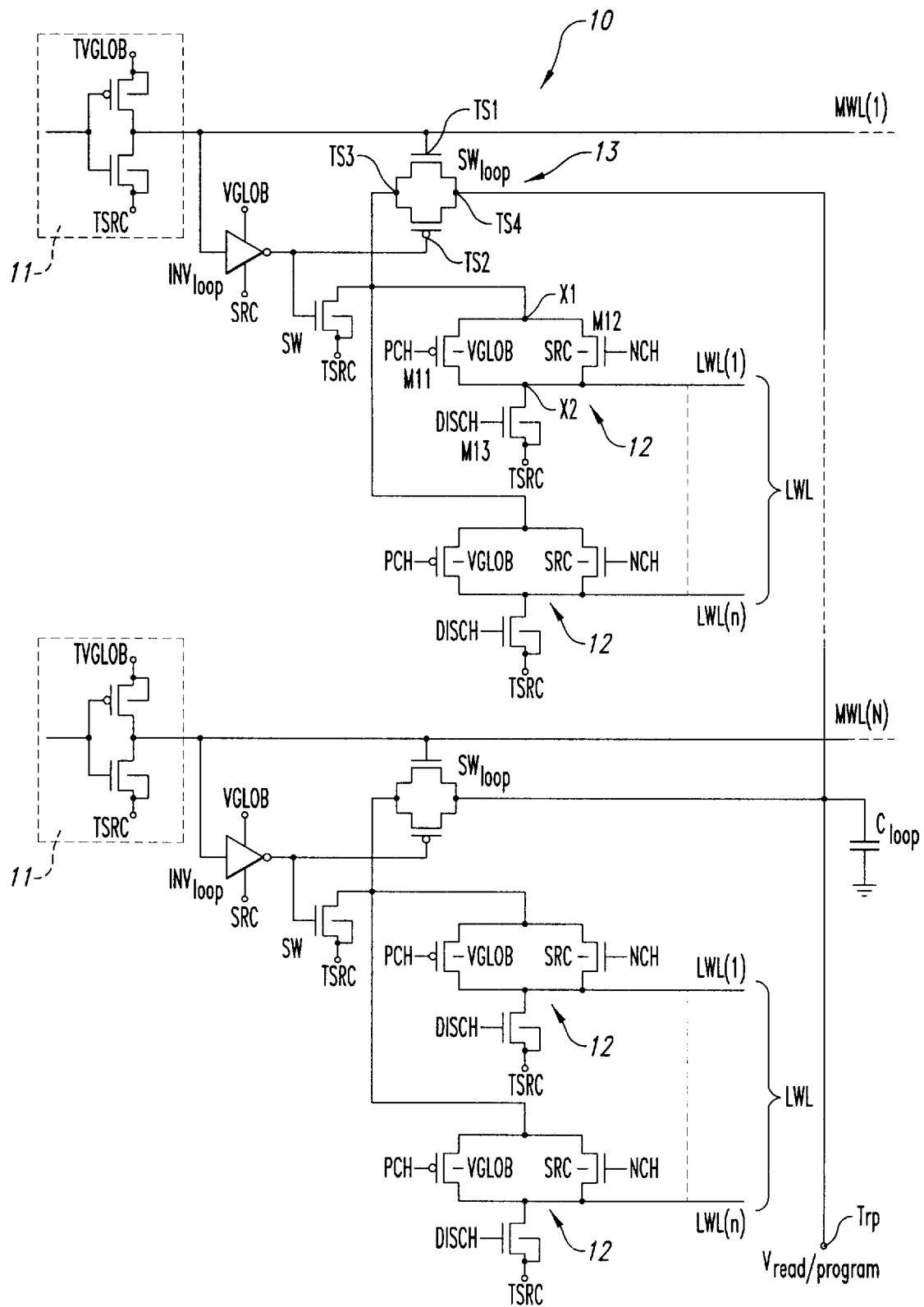
FIG. 2 shows diagramatically a hierarchic row decoding device according to the invention, as related to a single array sector.

With reference in particular to FIG. 2 of the drawings, a circuit device for hierarchic row decoding, according to this invention, is generally shown at 10 in schematic form.

As previously mentioned in connection with the state of the art, the cells contained in the sectors of the non-volatile memory array associated with the device 10 are ordered as plural local wordlines LWL(1), ..., LWL(n). In parallel with each row in the array is a main wordline MWL(1), ..., MWL(N), which extends through all the sectors having main rows in common. In each sector, the circuit device 10 is connected upstream of each local wordline LWL(1), ..., LWL(n) in the memory array.

The circuit device 10 has a main wordline driver 11 provided at each main wordline MWL(1), ..., MWL(N).

In particular, the drivers 11 are conventional drivers comprising essentially a pair of MOS transistors in a pull-up/pull-down configuration, as shown in FIG. 2.

The drivers 11 are connected between first TVGLOB and second TSRC bias terminals arranged to receive first VGLOB and second SRC bias signals, respectively.

The circuit device 10 further comprises a plurality of local decoders 12 connected to the local wordlines LWL.

Similar as previously explained for conventional devices, each local decoder 12 comprises a first transistor M11, of the PMOS type, having its conduction terminals connected to the conduction terminals of a second transistor M12, of the NMOS type, to form first X1 and second X2 terminals of the local decoder 12.

The body terminal of transistor M11 receives the first bias signal VGLOB, the gate terminal of the transistor receiving a first set signal PCH.

It should be noted that the first bias signal VGLOB is the supply to the row decode; accordingly, this supply will be the same as the supply voltage Vdd to the associated memory device during the read phase, and same as a boosted voltage Vpp (usually about 10V) during the program phase. It may exceed the supply voltage Vdd if the read operation requires that the wordline be voltage boosted.

The body terminal of transistor M12 receives the second bias signal SRC, the gate terminal of the transistor receiving a second set signal NCH. The value of the second bias signal SRC is equal to a negative voltage (about −8V) for erasing, and is 0V (GND) for the other operations.

The gate terminals of all transistors M11 and all transistors M12 of the devices 10 associated with the array rows of the same sector are connected together, and therefore, receive all the same voltage signal.

The local decoders 12 also have the second terminal X2 connected to a local wordline LWL, and connected to a conduction terminal of a third transistor M13, of the NMOS type, which has the other conduction terminal and the body terminal connected to the second bias terminal TSRC receiving the second bias signal SRC, the gate terminal receiving a working signal DISCH.

The gate terminals of all transistors M13 of the devices 10 associated with array rows in the same sector are connected together, and therefore, receive all the same voltage signal.

Advantageously, said first terminal X1 of the local decoders 12 is connected to a switch $SW_{loop}$ of the CMOS type.

In particular, this switch $SW_{loop}$ has a first control terminal TS1 connected directly to a main wordline MWL, and has a second, negated control terminal TS2 connected to the same main wordline through a logic inverter $INV_{loop}$, itself connected with an input to the main wordline MWL to receive the bias signals VGLOB and SRC.

The switch $SW_{loop}$ also has a third terminal TS3 connected to the first terminal X1 of the local decoders 12, and has a fourth terminal TS4 connected to an external terminal Trp to receive a read/program voltage $V_{read/program}$.

The hierarchic row decoding circuit device 10 further includes an additional switch SW, which may comprise an NMOS transistor having its conduction terminals connected between said first terminal X1 of the local decoders 12 and the second bias signal SRC and having a control terminal connected to said second negated control terminal TS2 of the switch $SW_{loop}$. This additional switch SW serves in particular to bias all the unselected wordlines to ground.

Advantageously, the switch $SW_{loop}$ will enable transfer of the read/program voltage $V_{read/program}$, applied to the external terminal Trp, to the local decoders 12 (and through the latter, to the gate terminal of the selected memory cell).

Thus, the transfer function for the voltage $V_{read/program}$ is served by a dedicated path 13, comprising essentially the switch $SW_{loop}$ connected to the external terminal Trp, which path in no way involves the overall row decode, and the main rows and their drivers.

In this way, the read/program voltages $V_{read/program}$ are no longer to go through the main wordline drivers 11 in order to reach the gate terminal of a selected cell. It follows that the capacitive loads presented by the overall decode and the local decode substrates will no longer be applied to the generators of the voltages $V_{read/program}$. These generators are only to drive one load $C_{loop}$ represented by the dedicated path 13 used to take the read/program voltages $V_{read/program}$ to the switches $SW_{loop}$.

On the contrary, the capacitances represented by the overall decode and the local decode substrates decode remain with the first bias signal VGLOB, which signal, however, no longer requires to be switched in a "fast" manner during the programming operations.

The supply voltage to the main wordline drivers 11 is biased for programming at a constant value ensuring that the switches $SW_{loop}$ associated with the deselected main rows are turned off.

For example, assuming a maximum program voltage in the 9V range, the bias signal VGLOB would have a constant value 9V.

Notice that the main wordlines MWL(O), ..., MWL(N) may either be different main wordlines belonging to the same array block or to different blocks.

It should be noted that, in a current-sensing method, an array block as above may correspond to an array sector, i.e., to a plurality of memory cells having their source terminals in common so that they can be erased simultaneously.

On the other hand, in a voltage-sensing method, an array block corresponds to an array sub-sector, i.e., a portion of the memory cells that have the source terminal in common, which portion is erased simultaneously with the other cells in the sector, although physically separated therefrom. In other words, each array sector is divided physically into plural sub-sectors operated logically alike.

This means that a single dedicated path 13 for transferring the read/program voltage $V_{read/program}$ can serve several blocks, e.g., m blocks 14 disposed vertically and commonly referred to as a "vertical group of m blocks", 15.

Figure 3:
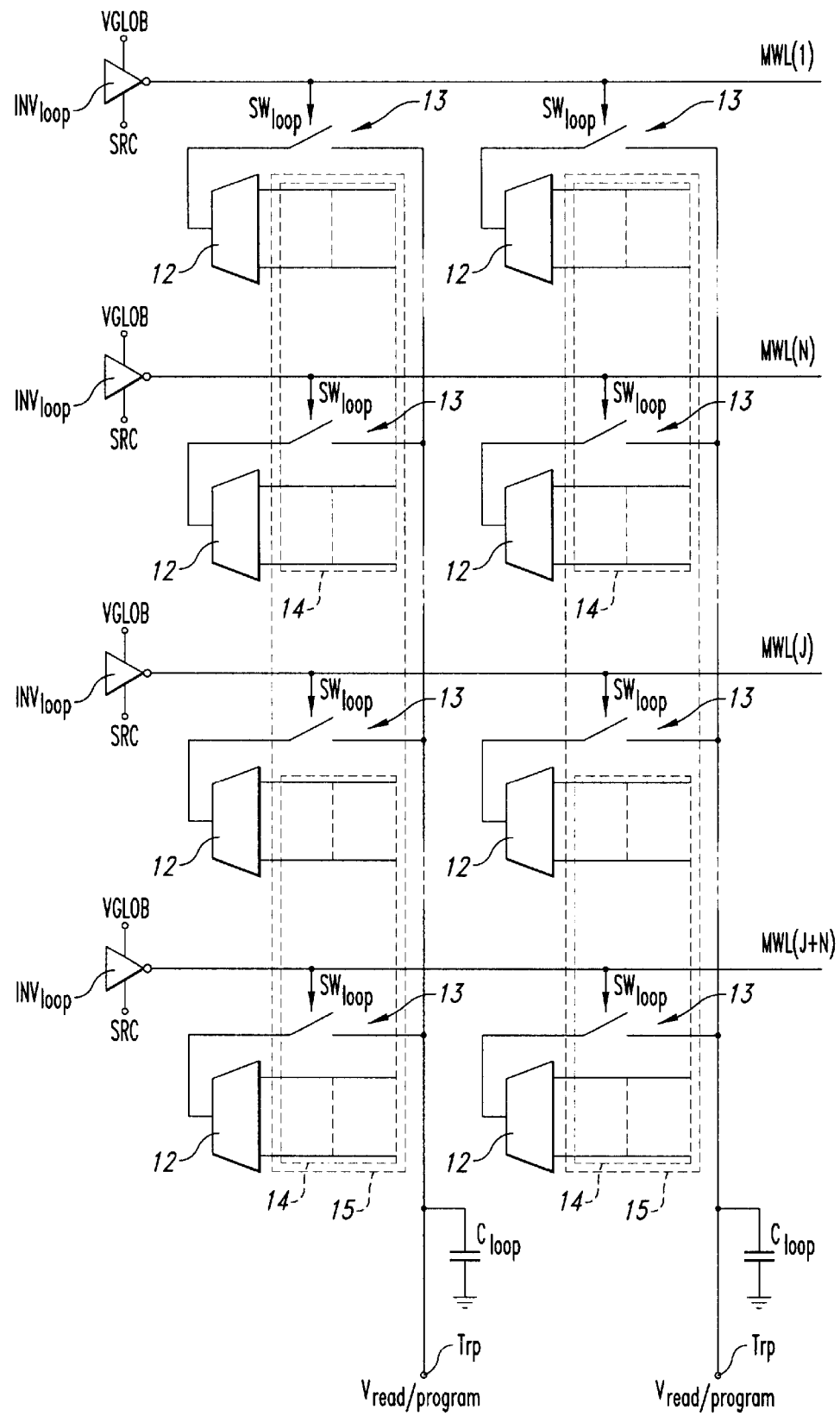
FIG. 3 shows diagramatically a hierarchic row-decoding device according to the invention, as related to plural array sectors.

It should be noted, moreover, that each main wordline MWL can drive more than one switch $SW_{loop}$, since it is shared by several array blocks disposed horizontally, as shown schematically in FIG. 3. In particular, each main wordline MWL will drive a switch $SW_{loop}$ for each block. In this case, a dedicated path 13 for transferring the read/program voltages $V_{read/program}$ would be provided for each block (or rather for each vertical group of m blocks).

The advantages offered by the circuit device 10 for hierarchic row decoding will now be discussed consistent with the sensing method adopted.

With the current-sensing method, the advantages in the respect of the capacitive loads to be switched during program operations are indeed considerable. In this case, programming a number of cells in parallel (a standard approach with conventional memory devices) requires that the program voltage $V_{program}$ be applied to a single dedicated path 13.

This because, in the current-sensing arrangement, cells that belong to the same "word" are tied physically to the same local wordline, and share the gate voltage (either for programming or reading).

Consequently, the advantage is greatest in terms of capacitive load compared to conventional hierarchic wordline decode arrangements.

Things are different, however, with the voltage-sensing method. Since the information to be extracted is here associated with the value of the gate voltage, cells comprising one word (and therefore, to be read simultaneously) cannot be tied physically to the same local LWL. It follows that the cells must belong to different local wordlines LWL and thus to different vertical groups of sub-sectors.

As the diagram of FIG. 3 shows more clearly, each gate terminal of a cell is arrived at over a different one of the dedicated paths 13 for transferring the read/program voltage $V_{read/program}$.

Thus, the load driven by the generator of the program voltage $V_{program}$ is multiplied by a factor equal to the degree of programming parallelism.

For example, with a degree n of parallelism (a widely used value for n may be 32), the overall load driven by the program voltage $V_{program}$ would be multiplied by that degree n.

The advantage is undoubtedly less than with the current-sensing method, but is still significant compared to conventional architectures, which involve loads at least three times as large.

Similarly, during the sense phase, the circuit device 10 for hierarchic row decoding follows different procedures for the current- and voltage-sensing methods.

The dedicated path 13 for transferring the program voltages is indeed the route to forcing or extracting the gate voltages during the read phase as well.

Therefore, the reduction in capacitive load enjoyed by the generator of the program voltage $V_{program}$ also applies to the generator (or extraction system) of the read voltage $V_{read}$.

However, the advantages from load reduction tend to be limited with the current-sensing method. While on the one side, a reduction in the capacitive load to be driven by the generator of read voltage $V_{read}$ leads to a higher rate of recovery of any noise on the read voltage $V_{read}$, on the other side, noise is augmented (and particularly so the charge sharing that occurs between the load $C_{loop}$ and the capacitance of the local wordline as the latter is selected).

Thus, these two effects tend to cancel out, leaving the overall performance substantially unaltered as regards the total time taken by the generator to regulate the value of the read voltage $V_{read}$.

Each time that the memory is accessed and the selected main wordline actuates a switch $SW_{loop}$, in fact, the load on the corresponding local wordline and the load $C_{loop}$ on the dedicated path 13 originate a charge-sharing phenomenon whereby the value of the read voltage Vread undergoes drops. In view of that in the current-sensing method the read voltage $V_{read}$ is to have an accurate value, the generator of the read voltage $V_{read}$ must ensure recovery of the desired value within a reasonable length of time.

As for the voltage-sensing method, the conclusions are quite different.

Whether an open-loop or a closed-loop voltage-sensing arrangement is adopted, in the respect of the read voltage $V_{read}$ the situation is the same as for programming.

In this case, the generator of read voltage $V_{read}$ "sees" a total load that is directly proportional to the number of cells being read simultaneously. At low degrees of parallelism, the total load is, however, lower than that of conventional decoding.

However, in the closed-loop voltage method, use of a circuit device 10 for hierarchic row decoding represents the single possible course to performing parallel reading from several cells. To this aim, the circuit device 10 for hierarchic row decoding provides as many dedicated paths 13 as there are cells being read simultaneously. Through these paths 13 the voltage values (originally all different from one another) can be regulated to be the same as the value of the voltage at the gate terminal of the selected cell.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit device for performing hierarchic row decoding in semiconductor memory devices of the non-volatile type, which memory devices comprise at least one array of memory cells with column-ordered sectors, wherein each sector has a respective group of local wordlines linked to a respective main wordline of a plurality of main wordlines, the circuit device comprising:

a plurality of main wordline drivers respectively provided at each main wordline;

a plurality of local decoders respectively provided at each local wordline; and for each main wordline, a dedicated path connected between said main wordline and the local decoders of the associated local wordlines, and connected to an external terminal arranged to receive a read/program voltage, said dedicated path enabling transfer of the read/program voltage to the local decoders.

2. A device according to claim 1, wherein each said dedicated path includes a switch having a first control terminal connected directly to said main wordline for said dedicated path, and having a second, negated control terminal connected to said main wordline for said dedicated path through a logic inverter.

3. A device according to claim 2, wherein each said switch also has a third terminal connected to a first terminal of the local decoders linked to said main wordline for said dedicated path in which said switch is included, and has a fourth terminal connected to said external terminal.

4. A device according to claim 2, wherein each said logic inverter has an input connected to the main wordline for said dedicated path in which said logic inverter is included and an output connected to said second negated control terminal of the switch of said dedicated path to receive first and second bias signals, which signals are also sent to the local decoders.

5. A device according to claim 2, further comprising an additional switch having conduction terminals connected between a first terminal of the local decoders for said local wordlines linked to one of said main wordlines and a bias terminal receiving a ground reference, and having a control terminal connected to said second negated control terminal of the switch of said dedicated path for said one of said main wordlines so as to bias to ground unselected local wordlines linked to said one of said main wordlines.

6. A device according to claim 5, wherein said additional switch comprises essentially an NMOS transistor having its source and drain terminals connected between said first terminal of the local decoders for said local wordlines linked to one of said main wordlines and said bias terminal, and having a gate terminal connected to said second negated control terminal of the switch of said dedicated path for said one of said main wordlines.

7. A device according to claim 2, wherein said main wordline drivers are supplied a supply voltage which is biased, during programming, at a constant value to ensure that the switches associated with deselected main wordlines are in an "off" state.

8. A device according to claim 1, wherein said main wordlines belong to a same array block, and said dedicated paths for said main wordlines are connected to said same array block only.

9. A device according to claim 8, wherein said dedicated parts for said main wordlines are respectively connected to vertical array blocks.

10. A device according to claim 9, wherein said array blocks form, from a logic standpoint, an array sector in a current-sensing arrangement.

11. A device according to claim 9, wherein said array blocks form, from a logic standpoint, an array sub-sector in a voltage-sensing arrangement.

12. A device according to claim 1, wherein said main wordlines belong to different array blocks, and said dedicated paths for said main wordlines are connected to plural vertically disposed array blocks.

13. A hierarchical memory circuit device, comprising:
a first main wordline for controlling a first row of memory cells;
a first plurality of local wordlines associated with the first main wordline;
a first plurality of local decoders respectively coupled to each local wordline;
an external terminal arranged to receive a read/program voltage; and
a first read/program control switch connected between the external terminal and each of the plurality of local decoders, the first read/program control switch including a first control teal coupled to the first main wordline, such that the read/program voltage is provided to the local decoders under control of the first main wordline.

14. The device of claim 13, wherein the first read/program control switch includes a negated second control terminal, the device further comprising a logic inverter connecting the first main wordline to the second control terminal.

15. The device of claim 14, wherein the logic inverter has first and second supply inputs and each of the local decoders includes first and second transistors connected in parallel between the first read/program control switch and a respective one of the local wordlines, the first and second transistors having respective body terminals connected to the first and second supply inputs of the logic inverter, respectively.

16. The device of claim 13, further comprising a bias switch having a first conduction terminal connected to each of the local decoders, a second conduction terminal connected to ground, and a control terminal connected to the first main wordline, so as to bias to ground unselected local wordlines linked to the first main wordline.

17. The device of claim 13, further comprising:
a second main wordline for controlling a second row of memory cells;
a second plurality of local wordlines associated with the second main wordline;
a second plurality of local decoders respectively coupled to each local wordline of the second plurality of local wordlines; and
a second read/program control switch connected between the external terminal and each local decoder of the second plurality of local decoders the second read/program control switch including a first control terminal coupled to the second main wordline, such that the read/program voltage is provided to the second plurality of local decoders under control of the second main wordline.

18. The device of claim 17, further comprising:
a third plurality of local wordlines associated with the first main wordline;
a third plurality of local decoders respectively coupled to each local wordline of the third plurality of local wordlines; and
a third read/program control switch connected between the external terminal and each local decoder of the third plurality of local decoders, the third read/program control switch including a first control terminal coupled to the first main wordline, such that the read/program voltage is provided to the third plurality of local decoders under control of the first main wordline.

19. The device of claim 13, further comprising:
a second plurality of local wordlines associated with the first main wordline;
a second plurality of local decoders respectively coupled to each local wordline of the second plurality of local wordlines; and
a second read/program control switch connected between the external terminal and each local decoder of the second plurality of local decoders, the second read/program control switch including a control terminal coupled to the first main wordline, such that the read/program voltage is provided to the second plurality of local decoders under control of the first main wordline.

20. A hierarchical memory circuit device, comprising:
a main wordline for controlling a row of memory cells;
a plurality of local wordlines associated with the main wordline;
a plurality of local decoders respectively coupled to each local wordline; and
switch means for providing a read/program voltage to the local decoders under control of the main wordline.

* * * * *

UNITED STATES PATENT AND TRADEMARK OFFICE
CERTIFICATE OF CORRECTION

PATENT NO.    : 6,493,268 B1                                    Page 1 of 1
DATED         : December 10, 2002
INVENTOR(S)   : Osama Khouri et al.

It is certified that error appears in the above-identified patent and that said Letters Patent is hereby corrected as shown below:

Title page,
Item [30], Foreign Application Priority Data should read as
-- MI00A 1585 --.

Column 9,
Lines 31 and 32, "wherein said dedicated parts" should read as -- wherein said dedicated paths --.
Line 57, "control teal" should read as -- control terminal --.

Signed and Sealed this

Twenty-second Day of April, 2003

JAMES E. ROGAN
*Director of the United States Patent and Trademark Office*